(12) United States Patent
Ozaki et al.

(10) Patent No.: US 7,705,114 B2
(45) Date of Patent: Apr. 27, 2010

(54) METHOD FOR PRODUCING POLYMER ORGANIC ELECTRONIC MATERIAL, POLYMER ORGANIC ELECTRONIC MATERIAL, AND ORGANIC ELECTROLUMINESCENT DEVICE

(75) Inventors: Tadayoshi Ozaki, Kanagawa (JP); Mieko Seki, Kanagawa (JP); Yohei Nishino, Kanagawa (JP); Koji Horiba, Kanagawa (JP); Hirohito Yoneyama, Kanagawa (JP); Daisuke Okuda, Kanagawa (JP); Hidekazu Hirose, Kanagawa (JP); Takeshi Agata, Kanagawa (JP); Toru Ishii, Kanagawa (JP); Kiyokazu Mashimo, Kanagawa (JP); Katsuhiro Sato, Kanagawa (JP); Hiroaki Moriyama, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 618 days.

(21) Appl. No.: 11/351,618

(22) Filed: Feb. 10, 2006

(65) Prior Publication Data

US 2006/0267487 A1 Nov. 30, 2006

(30) Foreign Application Priority Data

May 26, 2005 (JP) ............................. 2005-153806

(51) Int. Cl.
*C08F 6/00* (2006.01)
*B05D 5/12* (2006.01)
(52) U.S. Cl. ........................ 528/480; 313/503; 313/504; 427/66
(58) Field of Classification Search ................. 313/503, 313/504; 427/66; 528/480
See application file for complete search history.

(56) References Cited

U.S. PATENT DOCUMENTS

2003/0055179 A1* 3/2003 Ota et al. ..................... 525/242

FOREIGN PATENT DOCUMENTS

| JP | 7-109454 | 4/1995 |
|---|---|---|
| JP | 2002-138133 | 5/2002 |
| JP | 2002-216965 | 8/2002 |
| JP | 2005-041982 | 2/2005 |
| JP | 2005-044615 | 2/2005 |
| WO | 94/27417 | 11/1994 |

OTHER PUBLICATIONS

Proceedings of the 38$^{th}$ Meeting of the Japan Society of Applied Physics and Related Societies 31p-G-12, 1991.
Vincett et al., "Electrical Conduction and Low Voltage Blue Electroluminescence in Vacuum-Deposited Organic Films," Thin Solid Films, vol. 94, pp. 171-183 (1982).
Tang et al., "Organic electroluminescent diodes," Appl. Phys. Lett., vol. 51, pp. 913-915 (Sep. 21, 1987).
Gustafsson et al., "Flexible light-emitting diodes made from soluble conducting polymers," Nature, vol. 357, pp. 477-479 (Jun. 11, 1992).
Proceedings of the 38th Meeting of the Japan Society of Applied Physics and Related Societies, 31p-G-12 (Mar. 1991).

* cited by examiner

*Primary Examiner*—Terressa M Boykin
(74) *Attorney, Agent, or Firm*—Fildes & Outland, P.C.

(57) ABSTRACT

A method for producing a polymer organic electronic material comprising: synthesizing a polymer organic electronic material by condensing a precursor monomer for the polymer organic electronic material in the presence of a metal catalyst, preparing a polymer organic electronic material solution by dissolving the polymer organic electronic material in an organic solvent, and removing metal ions, which originate from the metal catalyst, from the polymer organic electronic material solution by using an ion exchange resin; a polymer organic electronic material which can be obtained by the method; and an organic electroluminescent device which uses the polymer organic electronic material.

3 Claims, 2 Drawing Sheets

[FIG. 1]
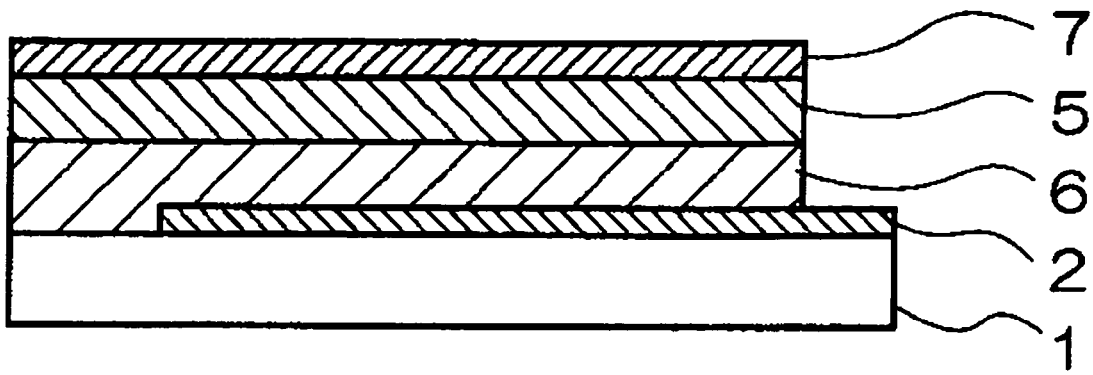
[FIG. 2]
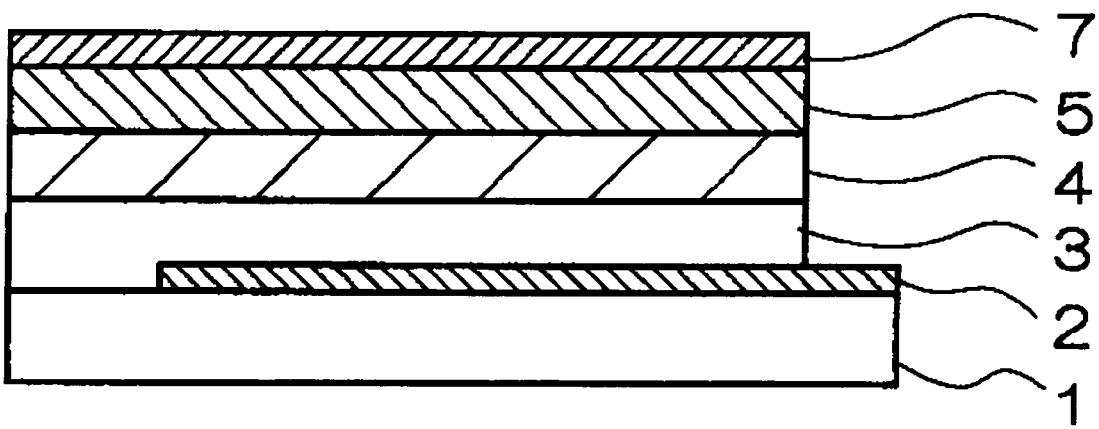
[FIG. 3]
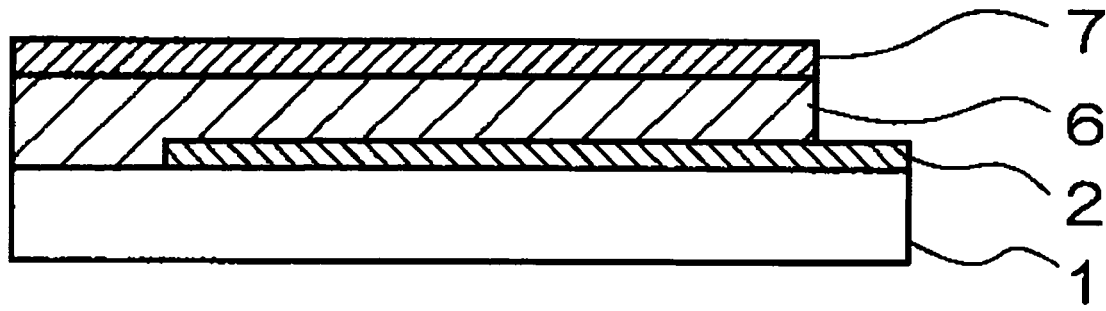

[FIG. 4]
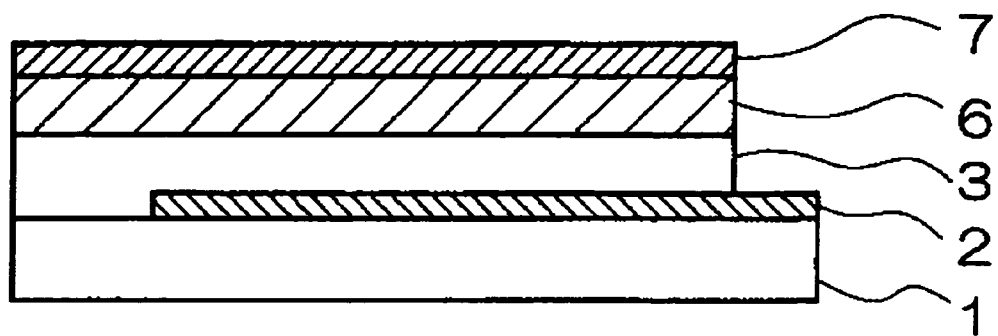

METHOD FOR PRODUCING POLYMER ORGANIC ELECTRONIC MATERIAL, POLYMER ORGANIC ELECTRONIC MATERIAL, AND ORGANIC ELECTROLUMINESCENT DEVICE

CROSS-REFERENCE TO RELATED APPLICATION

This application claims priority under 35 USC 119 from Japanese Patent Application No. 2005-153806, the disclosure of which is incorporated by reference herein.

BACKGROUND OF THE INVENTION

1. Field of the Invention

The present invention relates to a method for producing a polymer organic electronic material; a polymer organic electronic material which can be obtained by the method; and an organic electroluminescent device which uses the polymer organic electronic material.

2. Description of the Related Art

Organic electroluminescent devices (hereinafter, referred to as "organic EL devices") are promising for a wide range of applications because they are self-luminescent fully solid-state elements with a high visibility, and are also strong against impact. Currently, although those which use inorganic fluorescent materials are predominant, there are problems in that the production cost is high due to a necessity for alternating voltage of 200 V or more for operation, and the brightness is insufficient.

On the other hand, organic EL device research using organic compounds initially began by using single crystals such as anthracene and the like, although in the case of a single crystal, the film thickness was thick at approximately 1 mm, and a driving voltage of 100 V or more was required. For this reason, thinning of the films by vapor deposition methods is being attempted (refer to, for example, Thin Solid Films, Vol. 94, 171, (1982)).

However, the thin-films obtained by this method still have a high driving voltage of 30 V. Furthermore, since the density of electron and hole carriers within the film is low, and the generation probability of photons from the recombination of carriers is low, adequate brightness could not be obtained.

However, in recent years, function separated-type organic EL devices in which thin-films of a hole transporting organic low molecular weight compound and a fluorescent organic low molecular weight compound that possesses an electron transporting functionality are sequentially laminated by a vacuum deposition method, wherein a high brightness of 1000 cd/m$^2$ or more can be obtained at a low voltage of approximately 10 V, have been reported (refer to, for example, Appl. Phys. Lett., Vol. 51, 913 (1987)). Since then, research and development of laminated-type organic EL devices have been actively carried out.

However, in this type of organic EL device, since a thin-film of 0.1 μm or less is formed in plural deposition processes, pinholes tend to occur. In order to obtain sufficient performance, it is necessary to control film thickness under strictly managed conditions. Therefore, there are problems in that productivity is low, and area enlargement is difficult. Furthermore, since this organic EL device is operated at a high current density of a few mA/cm$^2$, Joule heat is generated in large quantities. Consequently, films of the hole transporting organic low molecular weight compound, the fluorescent organic low molecular weight compound, and the like, which are produced in an amorphous glass state by deposition, gradually become crystalline and ultimately melt, and phenomena, wherein the brightness decreases and dielectric breakdown occurs, are commonly observed. As a result, there is a problem in that the lifetime of the element is reduced.

For example, in the case of the electron transporting material, although the use of oxadiazole derivatives, including 2-(4-biphenylyl)-5-(4-tert-butylphenyl)-1,3,4-oxadiazole (PBO), as an electron transporting material has been proposed (refer to, for example, Japanese Patent Application Laid-Open (JP-A) No. 7-109454), the obtained thin-film has a tendency to crystallize, and also from the aspect of charge transport and injection characteristics, it cannot be said that these are sufficient. Moreover, there are very few types of electron transporting materials other than oxadiazole compounds, and further development of superior materials from the aspect of low voltage operation and high efficiency, as well as charge transport and injection characteristics, is desired.

On the other hand, research and development of single layer structured organic EL devices have been carried out with an aim to solve the problems relating to productivity and area enlargement in laminated-type organic EL devices. Moreover, devices using conductive polymers such as poly (p-phenylene vinylene) (refer to, for example, Nature, Vol. 357, 477 (1992)), and devices in which an electron transporting material and a fluorescent pigment blended within hole transporting polyvinyl carbazole (refer to, for example, Proceedings of the 38th Meeting of the Japan Society of Applied Physics and Related Societies 31p-G-12, 1991) have been proposed. However, brightness, light emitting efficiency, and the like, have not yet reached levels of the laminated-type organic EL devices using organic low molecular weight compounds.

The materials used in organic EL devices are required to be high purity materials in order to ensure long-term stability of the electrical characteristics and device lifetime. Accordingly, the materials used in organic EL devices are required to be highly purified by a purification process following synthesis. In particular, in the case of a polymer material, this requirement is attempted to be met by subjecting the polymer obtained following polymerization to solvent washing, or washing processes of various types by acid cleaning, alkaline cleaning, and the like, or by repetition of a reprecipitation process by dissolution in a good solvent followed by dropwise addition into a poor solvent. However, purification of polymer materials is generally difficult compared to low molecular weight compounds, and improvement in the electrical characteristics of organic EL devices following these processes was insufficient. Furthermore, the presence of the smallest amounts of impurities in the charge transporting polymer material used in organic EL devices greatly influenced the device, resulting in deterioration in electrical characteristics and lifetime of the device.

A process wherein dissolution in a good solvent and reprecipitation in a poor solvent is repeated has been disclosed (refer to, for example, Japanese National Publication No. 8-510285), although it was not possible to completely remove the unreacted monomers and the decomposed impurities produced at the time of polymerization, even with a high repetition frequency.

Furthermore, a purification method wherein Soxhlet extraction by methanol is performed has been disclosed (refer to, for example, Japanese Patent Application Laid-Open (JP-A) No. 2002-216965). However, in an extraction where a poor solvent such as methanol is used, due to low solubility, it was not possible to completely remove the unreacted monomers and the decomposed impurities.

A purification method wherein the low molecular weight components are removed by dialysis has been disclosed (refer to, for example, Japanese Patent Application Laid-Open (JP-A) No. 2002-138133), although it is only applicable to water-soluble polymers, and purification effects could not be observed for hydrophobic polymers.

Inventions which produce polymer hole transporting materials or light emitting materials by a filtration method have been disclosed (refer to, for example, Japanese Patent Application Laid-Open (JP-A) No. 2005-41982 and JP-A No. 2005-44615). This filtration method is one in which the hole transporting material or the light emitting material is prepared by passing the solution through a filter. However, the method was unsuitable for processing a large number of samples at once.

SUMMARY OF THE INVENTION

The present invention has been made in view of the above circumstances and provides method for producing a polymer organic electronic material, polymer organic electronic material, and organic electroluminescent device.

According to an aspect of the invention, a method for producing a polymer organic electronic material comprises synthesizing a polymer organic electronic material by condensing a precursor monomer for the polymer organic electronic material in the presence of a metal catalyst; preparing a polymer organic electronic material solution by dissolving the polymer organic electronic material in an organic solvent; and removing metal ions, which originate from the metal catalyst, from the polymer organic electronic material solution by using an ion exchange resin.

According to another aspect of the invention, a polymer organic electronic material is produced by a method for producing a polymer organic electronic material, the method comprising: synthesizing a polymer organic electronic material by condensing a precursor monomer for the polymer organic electronic material in the presence of a metal catalyst; preparing a polymer organic electronic material solution by dissolving the polymer organic electronic material in an organic solvent; and removing metal ions, which originate from the metal catalyst, from the polymer organic electronic material solution by using an ion exchange resin.

According to another aspect of the invention, an organic electroluminescent device comprises a pair of electrodes which at least one is transparent or translucent; and one or a plurality of organic compound layers between the pair of electrodes, wherein at least one layer of the organic compound layers is produced by a method for producing a polymer organic electronic material, the method comprising: synthesizing a polymer organic electronic material by condensing a precursor monomer for the polymer organic electronic material in the presence of a metal catalyst; preparing a polymer organic electronic material solution by dissolving the polymer organic electronic material in an organic solvent; and removing metal ions, which originate from the metal catalyst, from the polymer organic electronic material solution by using an ion exchange resin.

BRIEF DESCRIPTION OF THE DRAWINGS

FIG. 1 is a schematic cross-section view of an example of the organic EL device of the present invention.

FIG. 2 is a schematic cross-section view of another example of the organic EL device of the present invention.

FIG. 3 is a schematic cross-section view of another example of the organic EL device of the present invention.

FIG. 4 is a schematic cross-section view of another example of the organic EL device of the present invention.

DETAILED DESCRIPTION OF THE INVENTION

Hereinafter, the method for producing the polymer organic electronic material, the polymer organic electronic material, and the organic electroluminescent device of the present invention will be explained in detail.

The method for producing the polymer organic electronic material of the present invention comprises; a process for synthesizing a polymer organic electronic material by condensing a precursor monomer for the polymer organic electronic material in the presence of a metal catalyst (hereinafter, referred to as the synthesis process); a process for preparing a polymer organic electronic material solution by dissolving the polymer organic electronic material in an organic solvent (hereinafter, referred to as the dissolution process); and a process for removing metal ions, which originate from the metal catalyst, from the polymer organic electronic material solution by using an ion exchange resin (hereinafter, referred to as the purification process). According to the method of the present invention, since it is possible to remove the metal ions, which originate from the metal catalyst, from the polymer organic electronic material, it is possible to obtain a polymer organic electronic material with a low content of ionic impurities. Furthermore, the organic EL device of the present invention using the polymer organic electronic material of the present invention, which has a low content of ionic impurities, has favorable electrical characteristics and long lifetime.

First, each process in the method for producing the polymer organic electronic material of the present invention will be explained.

-Synthesis Process-

The synthesis process is a process for synthesizing the polymer organic electronic material by condensing a precursor monomer for the polymer organic electronic material in the presence of a metal catalyst.

The precursor monomer for the polymer organic electronic material is appropriately selected depending on the polymer organic electronic material to be produced. The polymer organic electronic material is not particularly limited, and examples thereof include hole transporting materials or light emitting materials, which are important as materials for organic electroluminescent devices.

The hole transporting material can be obtained by condensing the precursor monomer for the polymer organic electronic material in the presence of a metal catalyst. The specific examples of the hole transporting material include polyesters or polyamides which contain specific compounds in the molecule. Examples of the specific compounds include tetraphenylenediamine derivatives, triphenylamine derivatives, carbazole derivatives, stilbene derivatives, arylhydrazone derivatives, porphyrin-based compounds, and the like.

Further, the light emitting material can be obtained by condensing the precursor monomer for the polymer organic electronic material in the presence of a metal catalyst. Examples of the light emitting material include polyesters or polyamides which contain specific compounds in the molecule. Examples of the specific compounds include chelate-type organometallic complexes, multinuclear or condensed aromatic derivatives, perylene derivatives, coumarin derivatives, styrylarylene derivatives, silole derivatives, oxazole derivatives, oxathiazole derivatives, oxadiazole derivatives, and the like.

The metal catalyst which condenses the precursor monomer for the polymer organic electronic material is appropriately selected depending on the type of monomer used, and examples thereof include. methylates of Na or Mg; fatty acid salts and carbonates of Zn, Cd, Mn, Co, Ca, or Ba represented by zinc borate, zinc acetate; metallic Mg; oxides of Pb, Zn, Sb, Ge, or the like; and alkoxides of Ti or Sn, and the like.

The polymer organic electronic material is synthesized using the precursor monomer for the polymer organic electronic material in the presence or in the absence of a suitable solvent. Further, in the present invention, a polymer organic electronic material which has not undergone the purification process is hereinafter referred to as an "unpurified polymer organic electronic material".

Preferably, the obtained unpurified polymer organic electronic material is dispersed in a poor solvent to remove the unreacted monomers in the unpurified polymer organic electronic material.

-Dissolution Process-

The dissolution process in the present invention is a process for preparing the polymer organic electronic material solution by dissolution of the unpurified polymer organic electronic material in an organic solvent.

Usable organic solvents are not particularly limited as long as they dissolve the polymer organic electronic material. The specific examples of the organic solvents include hexane, cyclohexane, methylcyclohexane, methylcyclopentane, toluene, o-xylene, m-xylene, p-xylene, cumene, mesitylene, terpinolene, o-cymene, m-cymene, p-cymene, anisole, ethyltoluene, ethylxylene, dioxane, tetrahydrofuran, diethylether, methanol, ethanol, 1-propanol, 2-propanol, monochlorobenzene, dichlorobenzene, and the like. An organic solvent can be used alone, or two or more organic solvents can be mixed and used.

In order to remove the insoluble substances contained in the unpurified polymer organic electronic material, the polymer organic electronic material solution may be filtered as necessary.

-Purification Process-

The purification process in the present invention is a process for removing metal ions originating from metal catalysts from the polymer organic electronic material by using an ion exchange resin.

The purification method using ion exchange resins comprises a batch method and a column method. The batch method is used to add an ion exchange resin to the polymer organic electronic material solution and to carry out the ion exchange reaction while stirring. On the other hand, the column method performs ion exchange reaction while the polymer organic electronic material solution is passed through a column which has been filled with an ion exchange resin.

In the present invention, the purification effect can be obtained by employing either method, and by using a polymer organic electronic material which has been purified, the electrical characteristics of the organic EL device can be improved.

Specific examples of ion exchange resins include Amberlite, Amberlist, Daiyaion, Duolite, Sumichelate, and the like.

Ion exchange resins have two types of cation exchange resins and anion exchange resins. For removal of metal ions, cation exchange resins are effective. However, when the acidity of the cation exchange resin is high and the polymer organic electronic material is likely to cause hydrolysis, a mixture of a cation exchange resin and an anion exchange resin may be used as the ion exchange resin. Accordingly, hydrolysis of the polymer organic electronic material (a reduction in the molecular weight of the polymer organic electronic material) can be controlled. As a result, deterioration of the dissolution characteristics, film formation characteristics, and element characteristics, can be avoided.

There are no particular restrictions on the processing temperature as long as it falls in a range of the room temperature or higher to the boiling point of the solvent used.

The mass ratio of the polymer organic electronic material to the ion exchange resin in the polymer organic electronic material solution, when the metal ions are removed using the ion exchange resin, depends on the quantity of metal ions to be removed. The mass ratio is preferably from 1:0.001 to 1:100, and more preferably 1:0.01 to 1:50. Further, other metal ion absorbents other than the ion exchange resin can be used. Specific examples of other metal ion absorbents include chelate resins, and the like.

If impurities, such as uncrosslinked resin in the ion exchange resin are likely to be eluted depending on the organic solvent contained in the polymer organic electronic material solution, the ion exchange resin is washed in advance with the organic solvent to be used, whereby an improvement in the removal effect can be expected.

The polymer organic electronic material of the present invention is one which is obtained by the method of the present invention. Consequently, the organic EL device of the present invention which uses the polymer organic electronic material of the present invention has favorable electrical characteristics and long lifetime.

The organic EL device of the present invention comprises a pair of electrodes which at least one is transparent or translucent; and one or plural organic compound layers sandwiched between the pair of electrodes, wherein at least one of the organic compound layers contains the polymer organic electronic material of the present invention.

As long as the organic EL device of the present invention is one where at least one layer of the organic compound layers contains the polymer organic electronic material of the present invention, there are no particular restrictions on the layer configuration thereof In the present invention, in a case where the organic compound layer is one layer, the organic compound layer designates a light emitting layer which possesses a charge transporting functionality. Further, in a case where there are plural organic compound layers, one layer of the organic compound layers is a light emitting layer, and the other organic compound layers are charge transporting layers, that is, they represent hole transporting layers, electron transporting layers, or substances comprising hole transporting layers and electron transporting layers, and at least one layer contains the polymer organic electronic material of the present invention.

Specifically, the organic EL device may be one which comprises at least one light emitting layers and an electron transporting layer, or comprises at least one hole transporting layer, a light emitting layer and an electron transporting layer, or comprises at least one hole transporting layer and a light emitting layer, wherein at least one of these layers contains the polymer organic electronic material of the present invention. Further the organic EL device may be one which comprises only an organic compound layer as the light emitting layer, wherein the light emitting layer contains the polymer organic electronic material of the present invention.

In a case where the organic compound layer is one layer, the light emitting layer, which possesses a charge transporting functionality, is an organic compound layer wherein a light emitting material is dispersed in an amount of 50% by mass or less based on the charge transporting material imparted with a functionality (hole transporting functionality or electron transporting functionality) depending on the purpose. In order to adjust a balance of the holes and the electrons injected into the organic EL device, an electron transporting material may be also dispersed and mixed in a range of 1% by mass to 30% by mass.

For the light emitting layer, a compound showing a high fluorescence quantum yield in a solid state is used as the light emitting material. When the light emitting material is an organic low molecular weight compound, a satisfactory thin-film can be formed by the vacuum deposition method, or by applying and drying a solution or dispersion containing the organic low molecular weight compound and a binding resin. Further, when the light emitting material is a polymer, a satisfactory thin-film can be formed by applying and drying a solution or a dispersion containing the same.

Preferably, the organic low molecular weight compound may be selected from chelated organometallic complexes, multinuclear or condensed aromatic compounds, perylene derivatives, coumarin derivatives, styrylarylene derivatives, silole derivatives, oxazole derivatives, oxathiazole derivatives, oxadiazole derivatives, or the like, and the polymer may be selected properly from the polymer organic electronic materials mentioned above.

Further, a pigment compound that differs from the light emitting material may be doped as a guest material in the light emitting material mentioned above for the purpose of improving the durability or light emitting efficiency of the organic EL device. When the light emitting layer is formed by a vacuum deposition, doping is performed by codeposition, and when the light emitting layer is formed by applying and drying a solution or a dispersion, doping is performed by mixing the pigment compound in the solution or the dispersion. The doping proportion of the pigment compound in the light emitting layer is approximately 0.001% by mass to 40% by mass, and is preferably 0.01% by mass to 10% by mass. The pigment compound used in doping of this kind may be organic compounds, which have a good compatibility with the light emitting material and do not hinder the satisfactory film formation of the light emitting layer, and preferable examples thereof include DCM derivatives, quinacridone derivatives, rubrene derivatives, porphyrin-based compounds, and the like.

The hole transporting material may be solely formed by a charge transporting material imparted with a functionality (hole transporting functionality) depending on the purpose. Further, a specific organic low molecular weight compound may be included to adjust hole mobility, with a purpose such as further improving the electrical characteristics. When a specific organic low molecular weight compound is included to adjust hole mobility, the specific organic low molecular weight compound is dispersively mixed in a range of 0.1% by mass to 50% by mass. Preferred examples of the organic low molecular weight compound include tetraphenylenediamine derivatives, triphenylamine derivatives, carbazole derivatives, stilbene derivatives, arylhydrazone derivatives, porphyrin-type compounds, and the like. The electron transporting material to be used may be an organic compound which does not show strong electron interactions with the charge transporting material. Further, a pigment compound which differs from the light emitting material may be doped.

In addition, in order to improve film formation, other general purpose resins, and the like, can be mixed. Specific examples of the resins which can be used include conductive resins such as polycarbonate resins, polyester resins, methacrylic resins, acrylic resins, polyvinyl chloride resins, cellulose resins, urethane resins, epoxy resins, polystyrene resins, polyvinyl acetate resins, styrene-butadiene copolymers, vinylidene chloride-acrylonitrile copolymers, vinyl chloride-vinyl acetate-maleic anhydride copolymers, silicon resins, poly-N-vinylcarbazole resins, polysilane resins, polythiophene, polypyrrole, and the like. Further, additives such as commonly known antioxidants, ultraviolet absorbents, plasticizers, or the like, can be used.

When the organic compound layer is plural layers, the hole transporting layer may be solely formed by a charge transporting material imparted with a functionality (hole transporting functionality) depending on the purpose. Further, in addition to the charge transporting polymer, the aforementioned organic low molecular weight compound may be included to adjust hole mobility, with a purpose such as further improving the electrical characteristics. The organic low molecular weight compound may be dispersively mixed in a range of 0.1% by mass to 50% by mass. In addition, in order to improve film formation, other general purpose resins, or the like, can be mixed. Specific examples thereof are the same as those mentioned above.

In the organic EL device of the present invention, a hole transporting layer or a light emitting layer is firstly formed on the transparent electrode depending on the layer configuration of each organic EL device. The hole transporting layer and the light emitting layer are respectively deposited on the transparent electrode by the vacuum deposition method of a hole transporting material or a light emitting material, or by spin coating method, the dip coating method, or the like of a coating solution obtained by dissolving or dispersing the materials in an organic solvent.

The film thicknesses of the produced hole transporting layer, light emitting layer, and electron transporting layer are respectively 0.1 μm or less, and in particular are preferably in a range of 0.03 to 0.08 μm. Further, the film thickness of the light emitting layer, which possesses a charge transporting functionality, is preferably around 0.03 to 0.2 μm.

The layer configuration of the organic EL device of the present invention, which comprises layers containing the polymer organic electronic material of the present invention, will be explained in detail. The organic EL device of the present invention comprises a pair of electrodes, at least one of which is transparent or translucent, and one or a plurality of organic compound layers between the electrodes, one of which is the light emitting layer. In the present invention, when the organic compound layer is a single layer, the organic compound layer designates a light emitting layer which possesses charge transporting functionality. Further, when the organic compound layer is plural organic compound layers, one layer thereof is a light emitting layer, and the other organic compound layers are charge transporting layers, or in other words, the organic compound layers designate hole transporting layers, electron transporting layers, or substances comprising hole transporting layers and electron transporting layers.

FIG. 1, FIG. 2, FIG. 3, and FIG. 4 are schematic cross-section views showing the layer configuration of the organic EL device of the present invention. FIG. 1, FIG. 2, and FIG. 4 show examples of cases where the organic compound layer is plural layers, and FIG. 3 shows an example of a case where the organic compound layer is a single layer. In the figures, 1 denotes a transparent insulating substrate, 2 denotes a transparent electrode, 3 denotes a hole transporting layer, 4 denotes a light emitting layer, 5 denotes an electron transporting layer, 6 denotes a light emitting layer which possess a charge transporting functionality, and 7 denotes a back electrode.

The transparent insulating substrate 1 is preferably transparent in order to bring out the emitted light, and examples thereof include glass, plastic film, and the like. The transparent electrode 2 is preferably transparent in order to bring out the emitted light as described in the above transparent insulating substrate, and has a large work function for the injection of charges. The transparent electrode 2 may be oxide films such as indium tin oxide (ITO), tin oxide (NESA), indium oxide, zinc oxide, or the like, or translucent deposited or sputtered gold, platinum, palladium, or the like.

The organic compound layer, which is composed of charge transporting polymers, acts as a light emitting layer 6 which possesses a charge transporting functionality by mixing with a π-conjugated polymer in the case of the layer configuration of the organic EL devices shown in FIG. 1 and FIG. 3, and acts as a hole transporting layer 3 in the case of the layer configuration of the organic EL devices shown in FIG. 2 and FIG. 4. Specific examples of the π-conjugated polymer include poly-paraphenylene derivatives, polyparaphenylene vinylene derivatives, polythiophene derivatives, polyacetylene derivatives, and the like.

In the case of the layer configuration of the organic EL devices shown in FIG. 2 and FIG. 4, the hole transporting layer 3 may be solely formed by the charge transporting polymer, but a tetraphenylenediamine derivative, or the like may be used in order to adjust charge mobility. In this case, the tetraphenylenediamine derivative may be dispersed in a range of 1% by mass to 50% by mass to form the hole transporting layer 3.

For the light emitting layer shown in FIG. 2 and FIG. 4, which possesses a charge transporting functionality, the aforementioned π-conjugated polymer is used.

In the case of the layer configuration of the organic EL device shown in FIG. 3, the light emitting layer 6, which possesses a charge transporting functionality, is at least an organic compound layer in which the light emitting material is dispersed in an amount of 50% by mass or less in the charge transporting polymer. When the light emitting material is preferably an organic low molecular weight compound, the light emitting material may be selected suitably from chelated organometallic complexes, multinuclear or condensed aromatic compounds, perylene derivatives, coumarin derivatives, styrylarylene derivatives, silole derivatives, oxazole derivatives, oxathiazole derivatives, oxadiazole derivatives, or the like. Further, when the light emitting material is a polymer, the light emitting material may be selected from the polymer organic electronic materials mentioned above. In addition, an electron transporting material may be used in order to adjust a balance of the holes and the electrons injected into the organic EL device. In this case, 10% by mass to 50% by mass of the electron transporting material can be dispersed, or an electron transporting layer comprising electron transporting material can be inserted between the light emitting layer 6, which possesses a charge transporting functionality, and the back electrode 7.

The electron transporting material may be an organic compound which does not show strong electron interactions with the charge transporting polymer, preferably the compound shown in below, but the present invention is not limited thereto.

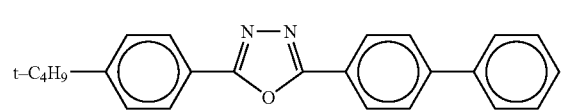

In the same manner, a suitable amount of a tetraphenylenediamine derivative may be dispersed at the same time in order to adjust charge mobility.

For the back electrode 7, a metal which can be vacuum deposited, and which has a small work function for electron injection, is used, and magnesium, aluminum, silver, indium, or their alloys are preferable.

In the organic EL device of the present invention, the hole transporting layer 3, or the light emitting layer 6 which has a charge transporting function, is formed by using a single charge transporting polymer, or a charge transporting polymer and a light emitting material, and as necessary, a coating solution obtained by dissolving or dispersing the electron transporting material and the charge transporting material in an organic solvent is used for film deposition on the transparent electrode using the spin coating method, the dip coating method, or the like. The film thickness of the charge transporting layer or the light emitting layer is preferably around 0.03 to 0.2 μm. The dispersion state of the light emitting material may be either a molecular dispersion state or a particulate dispersion state. In order to obtain the molecular dispersion state, a common solvent of the charge transporting polymer, the light emitting material, the electron transporting material, and the charge transporting material can be used preferable. On the other hand, in order to obtain the particulate dispersion state, a dispersion solvent can be selected in the consideration of dispersivity of the light emitting material, and the solubilities of the electron transporting material, the charge transporting material, or the charge transporting polymer. In order to disperse in a particulate state, a ball mill, a sand mill, a paint shaker, an attritor ball mill, a homogenizer, or the like, can be used.

On a layer containing the charge transporting polymer formed in the above manner, a light emitting material, an electron transporting material, and a back electrode are respectively formed by the vacuum deposition method. As a result, it is possible to easily produce an organic EL device. The film thicknesses of the light emitting layer which possesses a charge transporting functionality, and the electron transporting layer are respectively 0.1 μm or less, and preferably in a range of 0.03 to 0.08 μm.

The organic EL device of the present invention can, for example, be made to emit light by applying a direct current at a current density of 1 to 200 mA/cm² between the pair of electrodes.

Hereinafter, particularly preferable modes of the invention are listed. However, the invention is not necessarily limited to these modes. Some embodiments of the invention are outlined below.

According to an aspect of the invention, a method for producing a polymer organic electronic material comprises synthesizing a polymer organic electronic material by condensing a precursor monomer for the polymer organic electronic material in the presence of a metal catalyst; preparing a polymer organic electronic material solution by dissolving the polymer organic electronic material in an organic solvent; and removing metal ions, which originate from the metal catalyst, from the polymer organic electronic material solution by using an ion exchange resin, wherein the polymer organic electronic material may be a hole transporting material or a light emitting material, and the ion exchange resin may be a mixture of a cation exchange resin and an anion exchange resin, and a mass ratio of the polymer organic electronic material to the ion exchange resin in the polymer organic electronic material solution may be from 1:0.001 to 1:100, when metal ions are removed.

According to another aspect of the invention, a polymer organic electronic material is produced by a method for producing a polymer organic electronic material, the method comprising synthesizing a polymer organic electronic material by condensing a precursor monomer for the polymer organic electronic material in the presence of a metal catalyst; preparing a polymer organic electronic material solution by dissolving the polymer organic electronic material in an organic solvent; and removing metal ions, which originate from the metal catalyst, from the polymer organic electronic material solution by using an ion exchange resin.

According to yet another aspect of the invention, an organic electroluminescent device comprises a pair of electrodes which at least one is transparent or translucent; and one or a plurality of organic compound layers between the pair of electrodes, wherein at least one layer of the organic compound layers is produced by a method for producing a polymer organic electronic material, the method comprising: synthesizing a polymer organic electronic material by condensing a precursor monomer for the polymer organic electronic material in the presence of a metal catalyst; preparing a polymer organic electronic material solution by dissolving the polymer organic electronic material in an organic solvent; and removing metal ions, which originate from the metal catalyst, from the polymer organic electronic material solution by using an ion exchange resin.

EXAMPLES

Hereinafter, the present invention will be described with reference to examples, but is not limited thereto.

Synthesis Example 1

Synthesis of Exemplary Compound (1)

2 parts of N,N'-bis(3,4-dimethylphenyl)-N,N'-bis[4-(2-methoxycarbonylethyl)phenyl]-[1,1'-(3,3'-dimethyl)biphenyl]-4,4'-diamine as the monomer, and a further 8 parts of ethylene glycol and 0.1 parts of tetrabutoxytitanium are introduced into a 50 mL beaker, followed by heating and stirring at 200° C. for 4 hours under a nitrogen atmosphere. It is confirmed that the N,N'-bis(3,4-dimethylphenyl)-N,N'-bis[4-(2-methoxycarbonylethyl)phenyl]-[1,1'-biphenyl]-4,4'-diamine has been consumed, the reaction is continued for 5 hours with heating to 230° C. while ethylene glycol is distilled off by reducing the pressure to 0.5 mmHg. Thereafter, the reaction product is cooled to room temperature, dissolved in 50 parts of toluene, and the insoluble matter is removed by filtration with a 0.5 µm poly(tetrafluoroethylene) (PFTE) filter. The obtained filtrate is added dropwise into an excess of stirred methanol to precipitate the polymer. The obtained polymer dispersion is filtered, washed with methanol and dried to obtain 1.8 parts of the exemplary compound (1). The molecular weight is determined in a GPC, and thus, the result is Mw=1.15×10⁵ (styrene conversion).

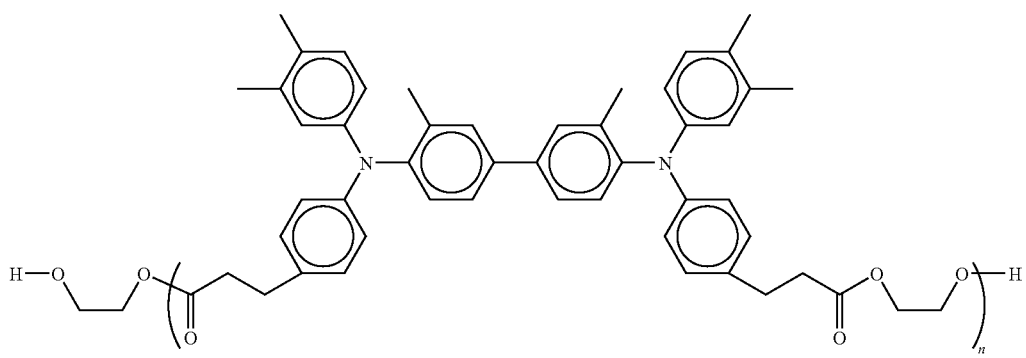

Exemplary Compound (1)

Synthesis Example (2)

Synthesis of Exemplary Compound (2)

1.8 parts of the exemplary compound (2) is prepared in the same manner as in Synthesis Example 1, except that the monomer is changed to N,N'-bis(3,4-dimethylphenyl)-N,N'-bis[4-(2-methoxycarbonylethyl)phenyl]-(1, 1'-terphenyl)-4, 4'-diamine. The molecular weight is $Mw=8\times10^4$ (styrene conversion).

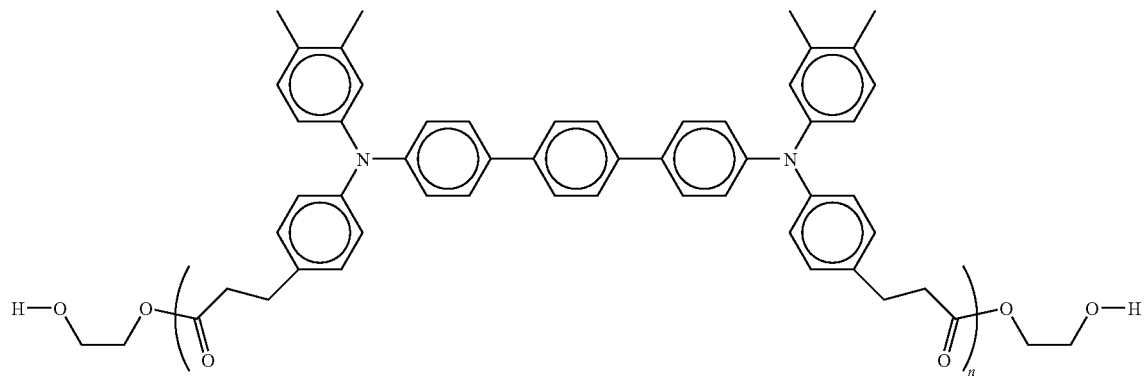

Exemplary Compound (2)

Synthesis Example 3

Synthesis of Exemplary Compound (3)

1.8 parts of the exemplary compound (3) is obtained in the same manner as in Synthesis Example 1, except that the monomer is changed to N,N'-bis(4-phenoxyphenyl)-N,N'-bis[4-(2-methoxycarbonylethyl)phenyl]-(1,1'-terphenyl)-4,4'-diamine. The molecular weight is $Mw=1.5\times10^5$ (styrene conversion).

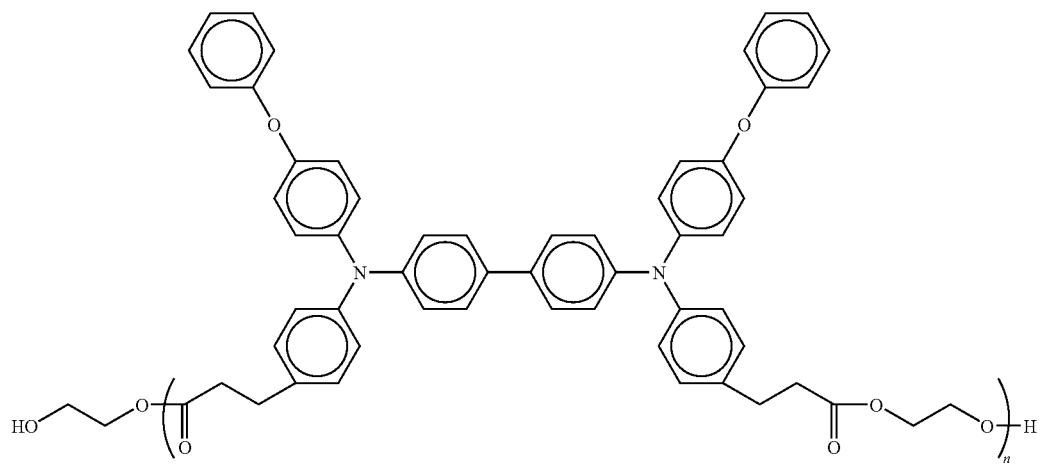

Exemplary Compound (3)

Synthesis Example 4

Synthesis of Exemplary Compound (4)

1.8 parts of the exemplary compound (4) is obtained in the same manner as in Synthesis Example 1, except that the monomer is changed to N,N'-bis(biphenyl)-N,N'-bis[4-(2-methoxycarbonylethyl)phenyl]-(1,1'-terphenyl)-4,4'-diamine. The molecular weight is Mw=6×10$^4$ (styrene conversion).

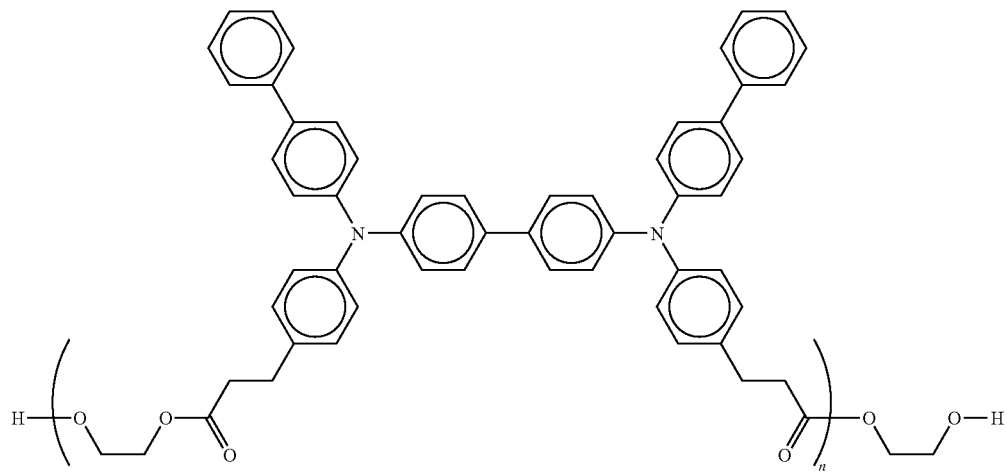

Exemplary Compound (4)

Example 1

1 part of the exemplary compound (1) obtained in Synthesis Example 1 is dissolved in 100 parts of toluene, 1 part of a cation ion exchange resin (Amberlyst15JS-HG•DRY, manufactured by ORGANO CORPORATION) is added, and the mixture is stirred at room temperature for 5 minutes. The ion exchange resin is separated by filtration, and the toluene solution is added dropwise into an excess of methanol. The precipitated polymer is filtered, dried, and purified. 0.9 parts of the purified polymer (1) is obtained.

The organic EL device is produced by using this polymer as follows:

An ITO glass substrate which has been etched with 2 mm wide rectangle shapes is ultrasonically cleaned in 2-propanol (industrial grade for electronics, manufactured by KANTO KAGAKU, CO., INC.), and then dried. A dichloroethane solution containing 5% by weight of the purified polymer (1) which has been subjected to filtration using a polytrifuloroethylene (PTFE) filter having a pore diameter of 0.1 μm is applied on the surface of the substrate by a dipping method to form a thin film having a thickness of 0.050 μm as a hole transporting layer. Following sufficient drying, Alq$_3$ (tris-8-(hydroxyquinoline)aluminium), which has been sublimation purified, is placed in a tungsten boat as the light emitting material, and is deposited by the vacuum deposition technique to form the light emitting layer with a film thickness of 0.05 μm on the hole transporting layer. The vacuum is 10$^{-5}$ Torr, and the temperature of the boat is 300° C. Next, a Mg—Ag alloy is deposited by codeposition to form the back electrode with a width of 2 mm and a thickness of 0.15 μm such that it intersects with the ITO electrode. The effective area of the formed organic EL device is 0.04 cm$^2$.

Example 2

Following dissolution of 1 part of the exemplary compound (2) obtained in Synthesis Example 2 in 100 parts of toluene, 1 part of a dual ion exchange resin (AmberlystM-SPS2-1•DRY manufactured by ORGANO CORPORATION) is added, and the mixture is stirred at room temperature for 10 minutes. The ion exchange resin is separated by filtration, and the obtained filtrate is added dropwise into an excess of stirred methanol to precipitate the polymer. The obtained polymer dispersion is filtered, washed with methanol and dried to obtain 0.8 parts of the purified polymer (2). The organic EL device is produced in the same manner as in Example 1.

Example 3

Following dissolution of 1 part of the exemplary compound (3) obtained in Synthesis Example 3 in 100 parts of p-xylene, 2 parts of a cation exchange resin (Amberlyst15JS-HG•DRY, manufactured by ORGANO CORPORATION) is added, and the mixture is stirred at room temperature for 30 minutes. The ion exchange resin is separated by filtration, and the obtained filtrate is added dropwise into an excess of methanol to precipitate the polymer. The obtained polymer dispersion is filtered, washed with methanol and dried to obtain 1.7 parts of the purified polymer (3). An ITO glass substrate which has been etched with 2 mm wide rectangle shapes is ultrasonically cleaned in 2-propanol (industrial grade for electronics, manufactured by KANTO KAGAKU, CO., INC.), and then dried. A dichloroethane solution containing 5% by weight of PEDOT (poly(ethylenedioxy)thiophene) which has been subjected to filtration using a polytrifuloroethylene (PTFE) filter having a pore diameter of 0.1 μm is applied on the surface of the substrate by a spin coating method to form a thin film having a thickness of 0.050 μm as a hole transporting layer. Following sufficiently drying, the purified polymer (3) is deposited by the same operation, and a light emitting layer with a film thickness of 0.050 μm is formed. Following sufficiently drying, 0.050 μm of Ca, and 0.10 μm of Al is sequentially deposited, and the back electrode with a width of 2 mm and a thickness of 0.15 μm is formed such that it intersects with the ITO electrode. The effective area of the formed organic EL device is 0.04 cm².

Example 4

1 part of the exemplary compound (4) obtained in Synthesis Example 3 is dissolved in 100 parts of toluene, to which 2 parts of a dual ion exchange resin (AmberlystMSPS2-1•DRY manufactured by ORGANO CORPORATION) is added, and the mixture is stirred at room temperature for 30 minutes. The ion exchange resin is separated by filtration, and the obtained filtrate is added dropwise to an excess of methanol to precipitate the polymer. The obtained polymer dispersion is filtered, washed with methanol and dried to obtain 1.6 parts of the purified polymer (3). An organic EL device is produced in the same manner as in Example 1.

Comparative Example 1

An organic EL device is produced in the same manner as in Example 1, except that the ion exchange process is not performed on the exemplary compound (1).

Comparative Example 2

An organic EL device is produced in the same manner as in Example 2, except that the ion exchange process is not performed on the exemplary compound (2).

Comparative Example 3

An organic EL device is produced in the same manner as in Example 3, except that the ion exchange process is not performed on the exemplary compound (3).

Comparative Example 4

An organic EL device is produced in the same manner as in Example 4, except that the ion exchange process is not performed on the exemplary compound (4).

Example 5

An organic EL device is produced in the same manner as in Example 1, except that the cation exchange resin Amberlyst15JS-HG•DRY is replaced with a strong acidity cation exchange resin diamond ion SK1B (manufactured by Mitsubishi Chemical Corporation).

Example 6

An organic EL device is produced in the same manner as in Example 1, except that the cation exchange resin Amberlyst15JS-HG•DRY is replaced with a cation exchange resin amberlite IRC748 (manufactured by Mitsubishi Chemical Corporation).

Comparative Example 5

1 part of the exemplary compound (1) obtained in Synthesis Example 1 is dissolved in 20 parts of toluene, and the mixture is added dropwise to an excess of methanol to precipitate the polymer. The obtained polymer dispersion is filtered, washed with methanol and dried to obtain 0.8 parts of the polymer. After the above operation is performed 3 times, an organic EL device is produced in the same manner as in Example 1, except that the ion exchange process is not performed.

Comparative Example 6

1 part of the exemplary compound (1) obtained in Synthesis Example 1 is subjected to Soxhlet extraction with methanol for 60 hours. The obtained polymer is dissolved in 20 parts of toluene, and the mixture is added dropwise into an excess of methanol to precipitate the polymer. The obtained polymer dispersion is filtered, washed with methanol and dried to obtain 0.8 parts of the polymer. An organic EL device is produced in the same manner as in Example 1, except that the ion exchange process is not performed.

Comparative Example 7

An organic EL device is produced in the same manner as in Example 1, except that the cation exchange resin Amberlyst15JS-HG•DRY is replaced with a porous membrane modified with an ion exchange group (ion clean SL manufactured by Nippon Paul Co.).

DC voltage is applied to each of the organic EL devices produced in the above Examples and Comparative Examples under a vacuum ($10^{-3}$ Torr), wherein the ITO electrode side is positive and the Mg—Ag back electrode side is negative, to emit light, thereby evaluating the luminescence starting voltage at this point, and the maximum brightness of the device at the driving current=20 mA/cm. Further, the current value is set such that the initial brightness becomes 50 cd/M², and the device lifetime (hour) is defined as the time required until the brightness is decreased to half from the initial value by driving under the constant current. The results are summarized in Table 1.

TABLE 1

| | Luminescence Starting Voltage (V) | Maximum Brightness (cd/m²) | Device Lifetime (hour) |
| --- | --- | --- | --- |
| Example 1 | 3.1 | 1120 | 70 |
| Example 2 | 3.6 | 1180 | 76 |
| Example 3 | 3.8 | 1000 | 65 |
| Example 4 | 3.5 | 1260 | 80 |
| Comparative Example 1 | 7.0 | 450 | 30 |
| Comparative Example 2 | 7.6 | 500 | 32 |
| Comparative Example 3 | 8.1 | 480 | 28 |
| Comparative Example 4 | 7.2 | 480 | 34 |
| Example 5 | 3.6 | 1000 | 67 |
| Example 6 | 3.0 | 1080 | 65 |
| Comparative Example 5 | 6.8 | 550 | 38 |
| Comparative Example 6 | 6.5 | 620 | 41 |
| Comparative Example 7 | 6.8 | 610 | 28 |

As is clear from Table 1, in the present invention, metal ions which originate from metal catalysts can be removed by treating the polymer organic electronic material with an ion exchange resin, and therefore, compared to untreated examples, favorable device characteristics of luminescence starting voltage and maximum brightness can be obtained.

According to the present invention, since the metal ions which originate from metal catalysts can be removed from the polymer organic electronic material, a polymer organic electronic material with a low content of ionic impurities can be obtained. Further, an organic EL device can be produced from the polymer organic electronic material which has a low content of ionic impurities in the present invention, and thus, it is possible to produce an organic EL device which has favorable electrical characteristics and long lifetime.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing a polymer organic electronic material comprising:
    synthesizing a polymer organic electronic material by condensing a precursor monomer for the polymer organic electronic material in the presence of a metal catalyst;
    preparing a polymer organic electronic material solution by dissolving the polymer organic electronic material in an organic solvent; and
    removing metal ions, which originate from the metal catalyst, from the polymer organic electronic material solution by using an ion exchange resin,
    the ion exchange resin is one of a cation exchange resin or a mixture of a cation exchange resin and an anion exchange resin, and a mass ratio of the polymer organic electronic material to the ion exchange resin in the polymer organic electronic material solution is from 1:0.001 to 1:100, when metal ions are removed,
    wherein the polymer organic electronic material is one of a polyester or polyamide that is a hole transporting material or light emitting material, and
    the polyester or polyamide includes one of a tetraphenylenediamine derivative, a triphenylamine derivative, a carbazole derivative, a stilbene derivative, an arylhydrazone derivative, a porphyrin-based compound, a chelate-type organometallic complex, a multinuclear or condensed aromatic derivative, a perylene derivative, a coumarin derivative, a styrylarylene derivative, a silole derivative, an oxazole derivative, oxathiazole derivatives or an oxadiazole derivative in the molecule.

2. A polymer organic electronic material produced by a method for producing a polymer organic electronic material, the method comprising:
    synthesizing a polymer organic electronic material by condensing a precursor monomer for the polymer organic electronic material in the presence of a metal catalyst;
    preparing a polymer organic electronic material solution by dissolving the polymer organic electronic material in an organic solvent; and
    removing metal ions, which originate from the metal catalyst, from the polymer organic electronic material solution by using an ion exchange resin,
    the ion exchange resin is one of a cation exchange resin or a mixture of a cation exchange resin and an anion exchange resin, and a mass ratio of the polymer organic electronic material to the ion exchange resin in the polymer organic electronic material solution is from 1:0.001 to 1:100, when metal ions are removed,
    wherein the polymer organic electronic material is one of a polyester or polyamide that is a hole transporting material or light emitting material, and
    the polyester or polyamide includes one of a tetraphenylenediamine derivative, a triphenylamine derivative, a carbazole derivative, a stilbene derivative, an arylhydrazone derivative, a porphyrin-based compound, a chelate-type organometallic complex, a multinuclear or condensed aromatic derivative, a perylene derivative, a coumarin derivative, a styrylarylene derivative, a silole derivative, an oxazole derivative, oxathiazole derivatives or an oxadiazole derivative in the molecule.

3. An organic electroluminescent device comprising:
    a pair of electrodes which at least one is transparent or translucent; and
    one or a plurality of organic compound layers between the pair of electrodes, wherein at least one layer of the organic compound layers is produced by a method for producing a polymer organic electronic material, the method comprising:
    synthesizing a polymer organic electronic material by condensing a precursor monomer for the polymer organic electronic material in the presence of a metal catalyst;
    preparing a polymer organic electronic material solution by dissolving the polymer organic electronic material in an organic solvent; and
    removing metal ions, which originate from the metal catalyst, from the polymer organic electronic material solution by using an ion exchange resin,
    the ion exchange resin is one of a cation exchange resin or a mixture of a cation exchange resin and an anion exchange resin, and a mass ratio of the polymer organic electronic material to the ion exchange resin in the polymer organic electronic material solution is from 1:0.001 to 1:100, when metal ions are removed,
    wherein the polymer organic electronic material is one of a polyester or polyamide that is a hole transporting material or light emitting material, and
    the polyester or polyamide includes one of a tetraphenylenediamine derivative, a triphenylamine derivative, a carbazole derivative, a stilbene derivative, an arylhydrazone derivative, a porphyrin-based compound, a chelate-type organometallic complex, a multinuclear or condensed aromatic derivative, a perylene derivative, a coumarin derivative, a styrylarylene derivative, a silole derivative, an oxazole derivative, oxathiazole derivatives or an oxadiazole derivative in the molecule.

* * * * *